(12) United States Patent
Shah et al.

(10) Patent No.: US 8,074,456 B2
(45) Date of Patent: Dec. 13, 2011

(54) THERMAL MANAGEMENT SYSTEM HAVING THERMOELECTRIC MODULES

(75) Inventors: Amip J. Shah, Santa Clara, CA (US); Cullen E. Bash, Los Gatos, CA (US); Christopher Gregory Malone, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 461 days.

(21) Appl. No.: 12/260,741

(22) Filed: Oct. 29, 2008

(65) Prior Publication Data

US 2010/0101236 A1 Apr. 29, 2010

(51) Int. Cl.
  *F25B 21/02* (2006.01)
(52) U.S. Cl. .......................... 62/3.2; 62/259.2
(58) Field of Classification Search ............ 62/3.2, 62/3.3, 3.7, 259.2
  See application file for complete search history.

(56) References Cited

U.S. PATENT DOCUMENTS

| | | | |
|---|---|---|---|
| 5,385,020 A | 1/1995 | Gwilliam et al. | |
| 5,431,021 A | 7/1995 | Gwilliam et al. | |
| 6,705,089 B2 | 3/2004 | Chu et al. | |
| 6,722,139 B2 | 4/2004 | Moon et al. | |
| 6,807,811 B2 | 10/2004 | Lee | |
| 7,240,494 B2 | 7/2007 | Akei et al. | |
| 7,325,407 B2 | 2/2008 | Chen | |
| 2003/0234008 A1* | 12/2003 | Van Winkle | 123/559.1 |
| 2006/0225441 A1 | 10/2006 | Goenka et al. | |
| 2008/0209913 A1 | 9/2008 | Sung | |

OTHER PUBLICATIONS

"HP Modular Cooling System: a technology overview and applications brief" http://h20000.www2.hp.com/bc/docs/support/SupportManual/c00600082/c00600082, downloaded Oct. 29, 2008.
"IBM Rear Door Heat Exchanger", http://www-03.ibm.com/servers/eserver/xseries/storage/pdf/IBM_RDHx_Spec_Sheet.pdf, downloaded Oct. 29, 2008.
Diller, R.W. et al., "Experimental Results Confirming Improved Efficiency of Thermoelectric Power Generation Systems with Alternate Thermodynamic Cycles," Abstract only.

* cited by examiner

*Primary Examiner* — Melvin Jones

(57) ABSTRACT

A thermal management system includes a first thermoelectric module, a second thermoelectric module, and a heat exchanger. The heat exchanger has a pipe having a first section, a second section and an intermediate section arranged between the first section and the second section. The intermediate section maintains the first section and the second section in spaced apart planes and the first thermoelectric module is thermally attached to the first section and the second thermoelectric module is thermally attached to the second section. The first thermoelectric module is spaced apart from the second thermoelectric module to enable fluid to flow between the first thermoelectric module and the second thermoelectric module.

14 Claims, 6 Drawing Sheets

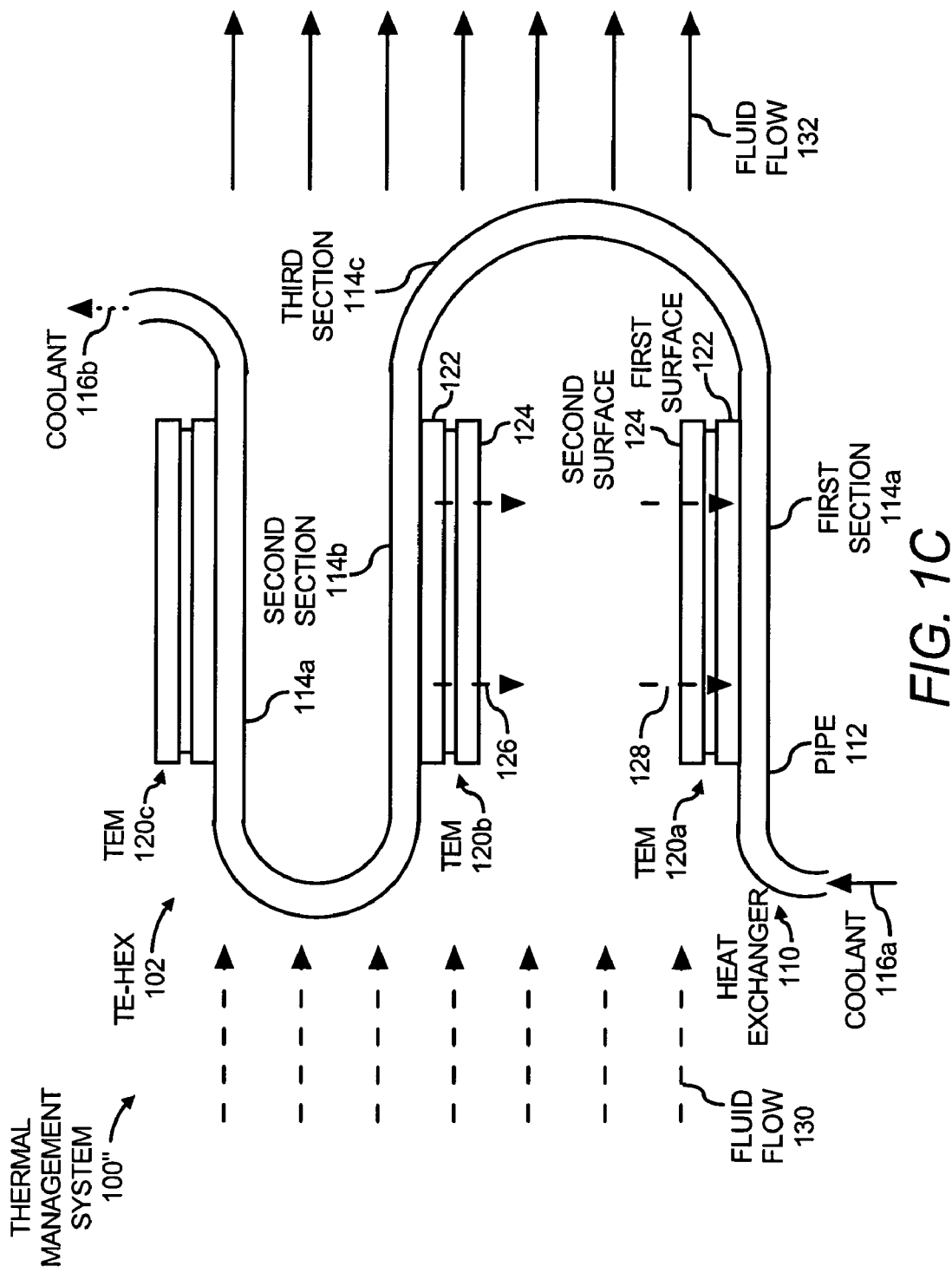

US 8,074,456 B2

THERMAL MANAGEMENT SYSTEM HAVING THERMOELECTRIC MODULES

BACKGROUND

As electronic chip devices become ever denser to achieve faster and faster processing speeds, there has been a corresponding increase in the amount of heat loads generated by the electronic chip devices. The electronic chip devices are often equipped with individual cooling devices, such as fans and heat sinks, designed to increase dissipation of the heat loads into ambient airflow. In addition, heat is typically removed from the ambient airflow through use of one or more room level air conditioning units.

Oftentimes, the level of heat load generation varies for different locations of a space containing the electronic chip devices. By way of example in which a plurality of electronic chip devices are arranged in multiple electronics racks, the electronic chip devices arranged in one of the electronics racks may generate a greater amount of heat load as compared with the electronic chip devices arranged in another one of the electronics racks. In this example, the one or more room level air conditioning units supplies both of sets of electronic chip devices with airflow that is at substantially the same temperature and at substantially the same flow rate. Thus, one set of electronic chip devices is likely to receive deficient amounts of cooling, while another set of electronic chip device is likely to receive an overabundance of cooling.

Those electronic chip devices that receive deficient amounts of cooling are likely have shorter useful lifespans. In addition, supplying unnecessarily high levels of cooling provisioning to the electronic chip devices results in inefficiencies and wasted energy consumption.

It would thus be desirable to enable temperature control without suffering from the drawbacks and disadvantages associated with conventional temperature control arrangements.

BRIEF DESCRIPTION OF THE DRAWINGS

Features of the present invention will become apparent to those skilled in the art from the following description with reference to the figures, in which:

FIGS. 1A-1C, respectively, show simplified schematic diagrams of thermal management systems 100, 100', 100", according to embodiments of the invention;

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a thermal management system and a method of controlling fluid flow temperature with the thermal management system. The thermal management system includes a plurality of thermoelectric modules positioned along a pipe of a heat exchanger. The pipe contains multiple sections that are in different planes, such that, at least a pair of thermoelectric modules are positioned opposite each other with a gap between the modules. The gaps generally enable fluid to flow past the thermoelectric modules and the thermoelectric modules are configured to either receive heat from or dissipate heat into the fluid flow. In addition, the pipe contains a coolant with which the thermoelectric modules are also configured to either receive heat from or dissipate heat into.

As described in greater detail herein below, the thermoelectric modules may be operated as thermoelectric coolers and/or thermoelectric generators. In addition, the thermoelectric modules and the heat exchanger may be operated in various manners to achieve one or more predetermined goals.

Through implementation of the thermal management system and the method of controlling fluid flow temperature with the thermal management system disclosed herein, the amount of energy required to maintain fluid flow temperatures at desired levels may substantially be reduced as compared with convention fluid flow cooling systems. In addition, the thermal management system and its implementation may be used to convert waste heat into electrical energy that may be used by the thermal management system or other electrical energy consuming devices, thus reducing costs associated with powering those devices.

Figure 1A:
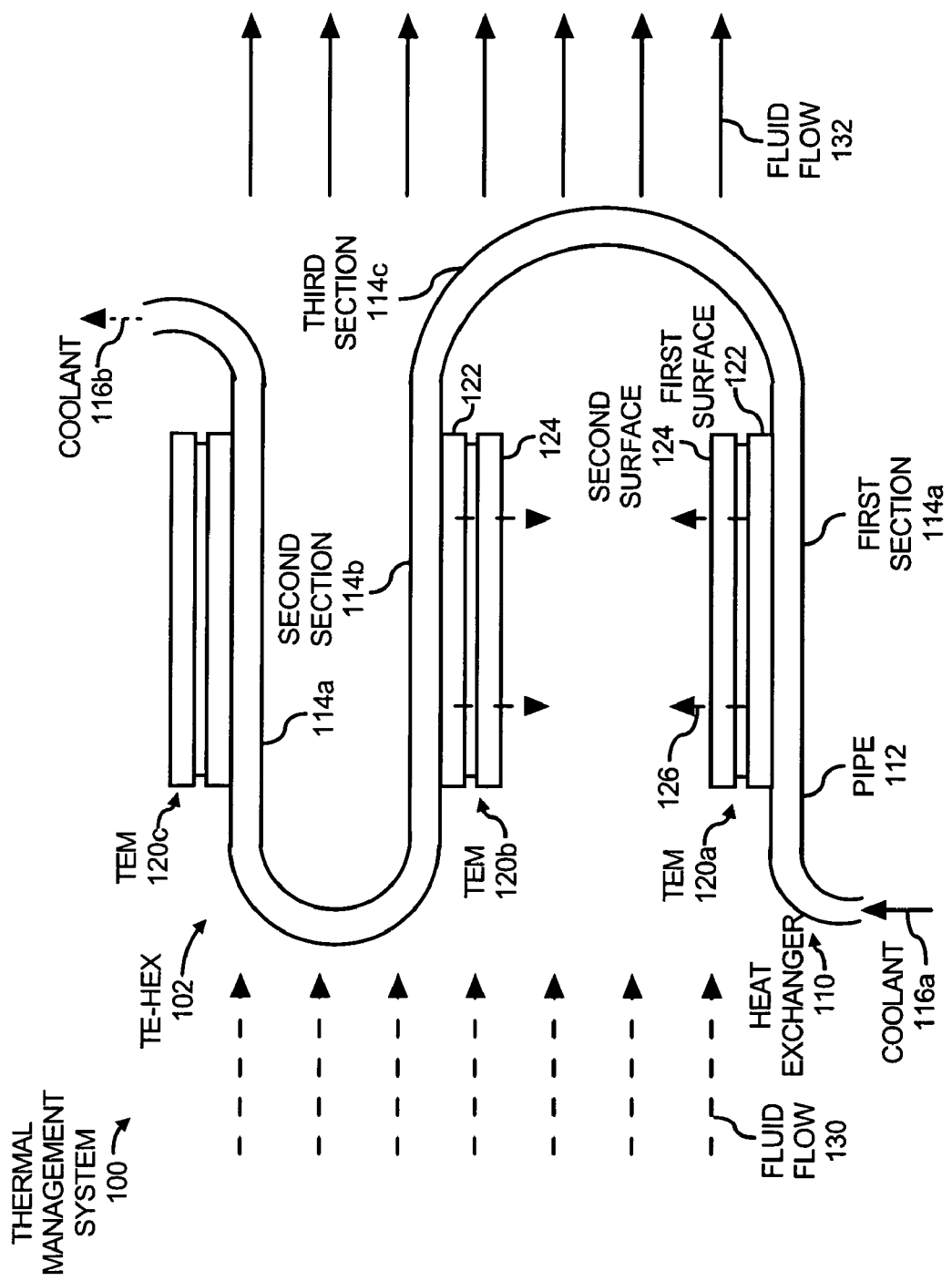

With reference first to FIG. 1A, there is shown a simplified schematic diagram of a thermal management system 100, according to an example. It should be understood that the thermal management system 100 may include additional elements and that some of the elements described herein may be removed and/or modified without departing from a scope of the thermal management system 100.

As shown, the thermal management system 100 includes a heat exchanger 110 and a plurality of thermoelectric modules (TEMs) 120a-120n (only 120a-120c are shown in FIG. 1A). As with conventional thermoelectric devices, the TEMs 120a-120n comprise N-type and P-type semiconductor material, such as bismuth telluride. In addition, the TEMs 120a-120n have a first surface 122 for absorbing heat and a second surface 124 for generating, when electricity is supplied to the modules 120a-120n. As such, the TEMs 120a-120n may be employed to produce a cooling effect on one medium by conveying heat from that medium to another medium. In addition, by varying the electrical current passing through the TEMs 120a-120n, the TEMs 120a-120n are able to handle varying heat loads and thus consume varying amounts of electricity.

In various instances, the TEMs 120a-120n are able to generate electricity when they are placed in positions where there is a relatively large temperature difference from one surface to the other surface of the TEMs 120a-120n. This generated electricity may be used to power various components, such as components of the heat exchanger 110, as well as other components that require electricity.

The heat exchanger 110 includes a pipe 112 formed of multiple sections. More particularly, the pipe 112 includes a first section 114a, a second section 114b, and an intermediate section 114c arranged between the first section 114a and the second section 114b. The intermediate section 114c maintains the first section 114a in a spaced relationship with respect to the second section 114b. As shown in FIG. 1A, the intermediate section 114c maintains the first section 114a in a substantially parallel relationship with the second section 114b. It should however be understood that the first section 114a need not have a substantially parallel relationship with the second section 114b, but instead, may have any suitable spaced relationship with the second section 114b. In addition, the sections 114a-114c may be arranged in a repeated pattern for any suitable length of the pipe 112.

The heat exchanger 110 also includes a coolant 116a, 116b that flows through the pipe 112 and is configured to transfer heat either to or from the TEMs 120a-120n. The coolant 116a, 116b may also be configured to transfer heat either to or from fluid flow that passes by the pipe 112. Thus, the coolant 116a, 116b may comprise any suitable fluid material that is capable of flowing through the pipe 112 and is capable of absorbing and dissipating heat in a relatively efficient manner. Examples of suitable fluid materials include water, water at reduced pressure, refrigerants, gases, etc.

According to an example, the coolant 116a enters into the pipe 112 at a relatively low temperature state (116a) and exits the pipe 112 at a relatively high temperature state (116b). In this example, the heat exchanger 110 may also include a cooling device (not shown) that is configured to reduce the temperature of the coolant 116a, 116b before supplying the coolant 116a, 116b into the pipe 112 or as the coolant 116a, 116b circuits through the pipe 112. The cooling device may comprise any reasonably suitable device for reducing the temperature of the coolant 116a, 116b, such as, a vapor-compression type heat exchanger, a water chiller type heat exchanger, a heat dissipating apparatus composed of fins and a fan, etc. The cooling device may also comprise a secondary heat exchanger for indirectly cooling the coolant 116a, 116b. In addition, the cooling device may be configured to cool the coolant 116b and recirculate the cooled coolant back into the pipe 112 or to provide new coolant 116a into the pipe 112. In the latter example, the coolant 116b may be discarded once it is expelled from the pipe 112 and new coolant 116a may be introduced into the pipe 112.

As further shown in FIG. 1A, the plurality of TEMs 120a-120n are attached to various sections 114a and 114b of the pipe 112. More particularly, FIG. 1A depicts a first TEM 120a attached to the first section 114a and a second TEM 120b attached to the second section 114b. The TEMs 120a-120n are thermally attached to their respective sections 114a, 114b of the pipe 112 in one or more manners that enables thermal conduction between the TEMs 120a-120n and the coolant 116a, 116b. The thermal connection may be enhanced in one example through use of a thermally conductive material, such as thermal adhesive, epoxy, etc., to connect the TEMs 120a-120n to their respective pipe sections 114a and 114b. In addition, or alternatively, the pipe sections 114a, 114b may comprise substantially flat sections at least in those locations where they contact the TEMs 120a-120n to provide a relatively greater surface area over which heat may be conducted between the coolant 116a, 116b and the TEMs 120a-120n. Furthermore, the pipe sections 114a-114c and/or the TEMs 120a-120n may be provided with fins or other means for increasing heat conduction to substantially increase surface areas over which heat may be conducted. As a yet further example, the pipe sections 114a, 114b may be integrated into respective ones of the first surfaces 122 and the second surfaces 124 of the TEMs 120a-120n.

The TEMs 120a-120n may also include features that enhance heat transfer with the fluid flow denoted by the arrows 130. By way of example, the TEMs 120a-120n may be equipped with fins or other extended surfaces to create relatively large surface areas over which heat may be transferred from the fluid flow to the TEMs 120a-120n.

According to an example, the heat exchanger 110 and the TEMs 120a-120n, collectively referred to herein as a TE-HEX 102, are configured to cool fluid flow as it passes over sections of the TE-HEX 102. This is denoted by arrows 130 that represent the relatively hotter fluid flow and arrows 132 that represent the relatively cooler fluid flow 132. Thus, for instance, the TE-HEX 102 arrangement depicted in FIG. 1A may be employed in various applications where the removal of heat is desired from a fluid flow. The fluid flow may comprise any suitable fluid, such as, air or other gases, water, water droplets, or other liquids.

In addition, the TE-HEX 102 may be employed in various applications where temperature gradients may be exploited to generate electricity. By way of particular example, the TE-HEX 102 disclosed herein may be positioned at an inlet or an outlet of an electronics rack, at an inlet or an outlet of a heat generating component, such as a server, hard drive, switch, etc., in a ventilation tile, in a room-level air conditioning unit, in an air conditioning unit for a vehicle, in a cooling system for a vehicle, in a manufacturing apparatus, etc.

The TE-HEX 102 may also be strategically placed on the particular apparatuses. By way of particular example, the TE-HEX 102 may be positioned downstream of the exhaust of high heat generating components in a rack to thus reduce the temperature of the fluid flow being exhausted out of those components.

As depicted in FIG. 1A, the TEMs 120a-120n are positioned and may be operated such that the first surfaces 122 of the TEMs 120a-120n are in thermal contact with respective first and second sections 114a, 114b of the pipe 112 and with the second surfaces 124 of the TEMs 120a-120n facing away from the pipe 112. In this configuration, the first surfaces 122 comprise the heat absorbing sides and the second surfaces 124 comprise the heat dissipating sides of the TEMs 120a-120n. In addition, heat is transferred across the TEMs 120a-120n as shown by the arrows 126. Therefore, the TEMs 120a-120n operate to draw heat from the coolant contained in the pipe 112 and to dissipate the absorbed heat into the heated fluid flow 130. This TE-HEX 102 configuration is designed to cause the fluid flow 130 to have a relatively high temperature as it passes by the TEMs 120a-120n, and in some instances, to become heated as it flows past the TEMs 120a-120n. One result of this TE-HEX 102 configuration and operation is that a relatively large temperature difference is maintained between the absorbing and the dissipating surfaces of the TEMs 120a-120n. The large temperature difference increases the efficiencies of the TEMs 120a-120n, which causes them to consume relatively less amounts of electricity in absorbing heat from the coolant 116a, 116b.

Furthermore, in the example depicted in FIG. 1A, heat from the fluid flow 130 is absorbed back into the coolant 116a, 116b as the fluid flow 130 flows over the intermediate section 114a of the pipe 112. Heat from the fluid flow 130 may also be absorbed into the coolant over parts of the other sections 114a, 114b of the pipe 112. Although not shown, heat transfer between the fluid flow 130 and the coolant 116a, 116b may be enhanced through inclusion of fins or other apparatuses designed to increase the surface area of the pipe 112.

In FIG. 1A, the coolant 116a, 116b thus operates to cool the fluid flow 130 and the TEMs 120a-120n operate to cool the coolant 116a, 116b. The manner in which the TEMs 120a-120n are arranged along the pipe 112 enable the coolant 116a, 116b to be heated and cooled in an alternating fashion to thus enable the fluid flow 130 to be cooled while operating the TEMs 120a-120n in a relatively energy-efficient manner. As discussed above, the coolant 116a, 116b may further be cooled through operation of a cooling device configured to either directly or indirectly cool the coolant 116a prior to be introduced into the pipe 112 to thus initially cause the coolant 116a to have a relatively low temperature.

Figure 1B:
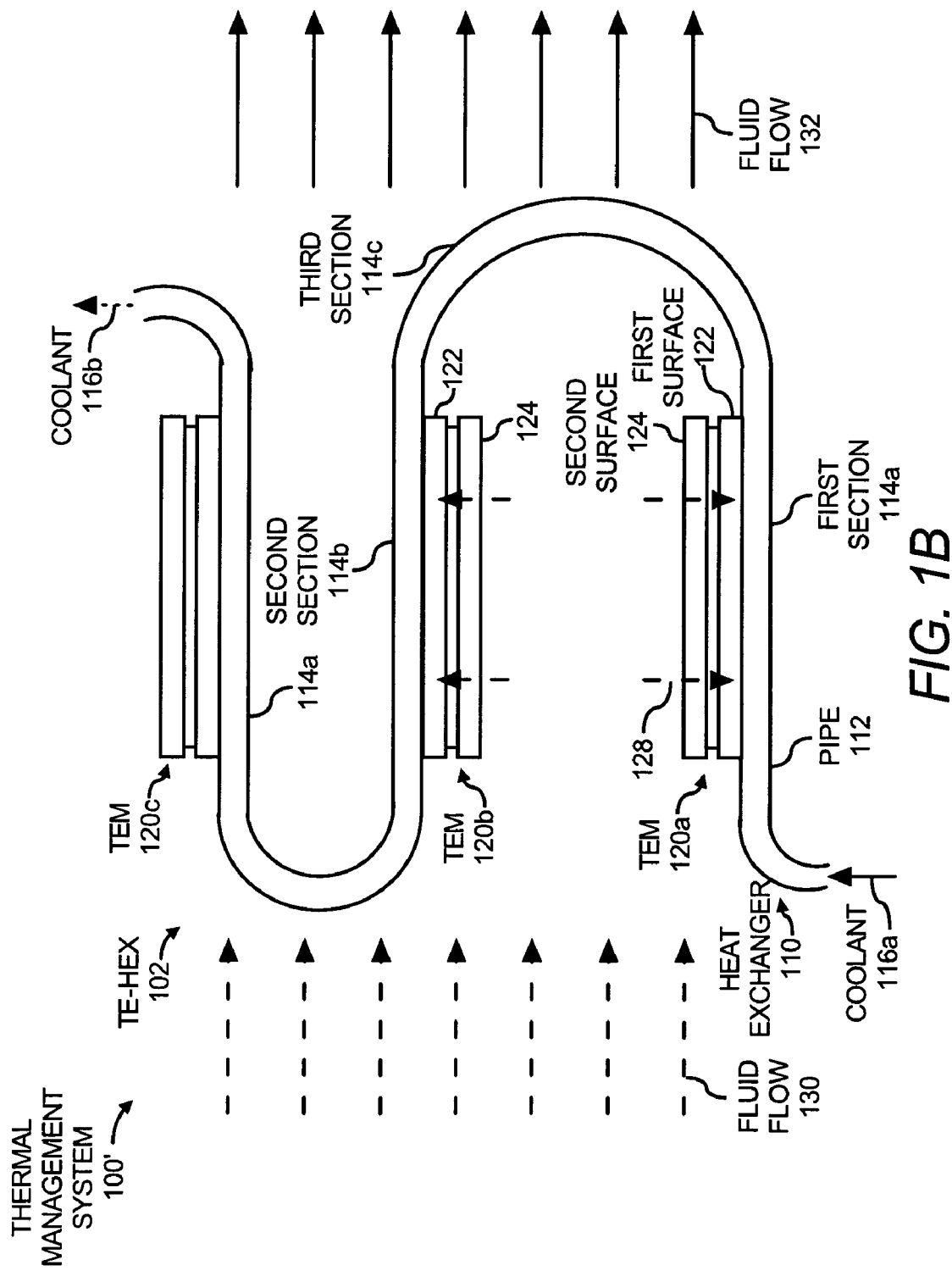

Turning now to FIG. 1B, there is shown a simplified schematic diagram of a thermal management system 100' for controlling fluid temperature, according to another example. It should be understood that the thermal management system 100' may include additional elements and that some of the elements described herein may be removed and/or modified without departing from a scope of the thermal management system 100'.

The thermal management system 100' includes all of the same elements as the thermal management system 100 and thus a discussion of those common elements will not be provided again with respect to FIG. 1B. Instead, only those elements that differ will be described.

The main distinction is that in the thermal management system 100', the first surfaces 122 comprise the heat dissipating sides and the second surfaces 124 comprise the heat absorbing sides of the TEMs 120a-120n. In this configuration, heat is absorbed from the fluid flow 130 at the second surfaces 124 and transferred across the first surfaces 122 to the coolant 116a, 116b, as indicated by the arrows 128. Thus, for instance, this configuration generally enhances heat removal from the fluid flow 130 as it flows past the TE-HEX 102 as compared with the configuration depicted in FIG. 1A.

Turning now to FIG. 1C, there is shown a simplified schematic diagram of a thermal management system 100" for controlling fluid temperature, according to a further example. It should be understood that the thermal management system 100" may include additional elements and that some of the elements described herein may be removed and/or modified without departing from a scope of the thermal management system 100".

The thermal management system 100" includes all of the same elements as the thermal management system 100 and thus a discussion of those common elements will not be provided again with respect to FIG. 1C. Instead, only those elements that differ will be described.

The main distinction is that in the thermal management system 100", the first surface 122 of a first TEM 120a comprises the heat dissipating side and the second surface 124 of the first TEM 120a comprises the heat absorbing side. In addition, the first surface 122 of a second TEM 120b comprises the heat absorbing side and the second surface 124 of the second TEM 120b comprises the heat dissipating side. In this configuration, the first surface 122 of the second TEM 120b, and the first surfaces 122 of similarly positioned TEMs, absorbs heat from the coolant 116a, 116b and the heat is conveyed out of the second surface 124 of the second TEM 120b. The heat outputted from the second surface 124 of the second TEM 120b is dissipated into the fluid flow 130 as it passes by the second surface 124, as indicated by the arrows 126. In addition, heat from the fluid flow 130 is absorbed by the second surface 124 of the first TEM 120a, and the second surfaces 124 of similarly positioned TEMs, and conveyed to the coolant 116a, 116b through the first surface 122 of the first TEM 120a.

The configuration depicted in FIG. 1C generally enables the first TEM 120a, and similarly situated TEMs 120c, etc., to operate as thermoelectric generators configured to generate electricity by converting the heat energy into electrical energy as the heat energy is conveyed from the second surfaces 124 to the first surfaces 122. The generated electrical energy may be used to supply power to one or more components of the heat exchanger 110, the TEMs 120a-120n, as well as one or more other components.

Although not explicitly depicted in FIGS. 1A-1C, the TE-HEX 102 may include combinations of variously positioned and operated TEMS 120a-120n. Thus, for instance, a TE-HEX 102 may include the configuration depicted in FIG. 1A in one section of a structure and the configuration depicted in FIG. 1B in another section of the structure.

Figure 2:
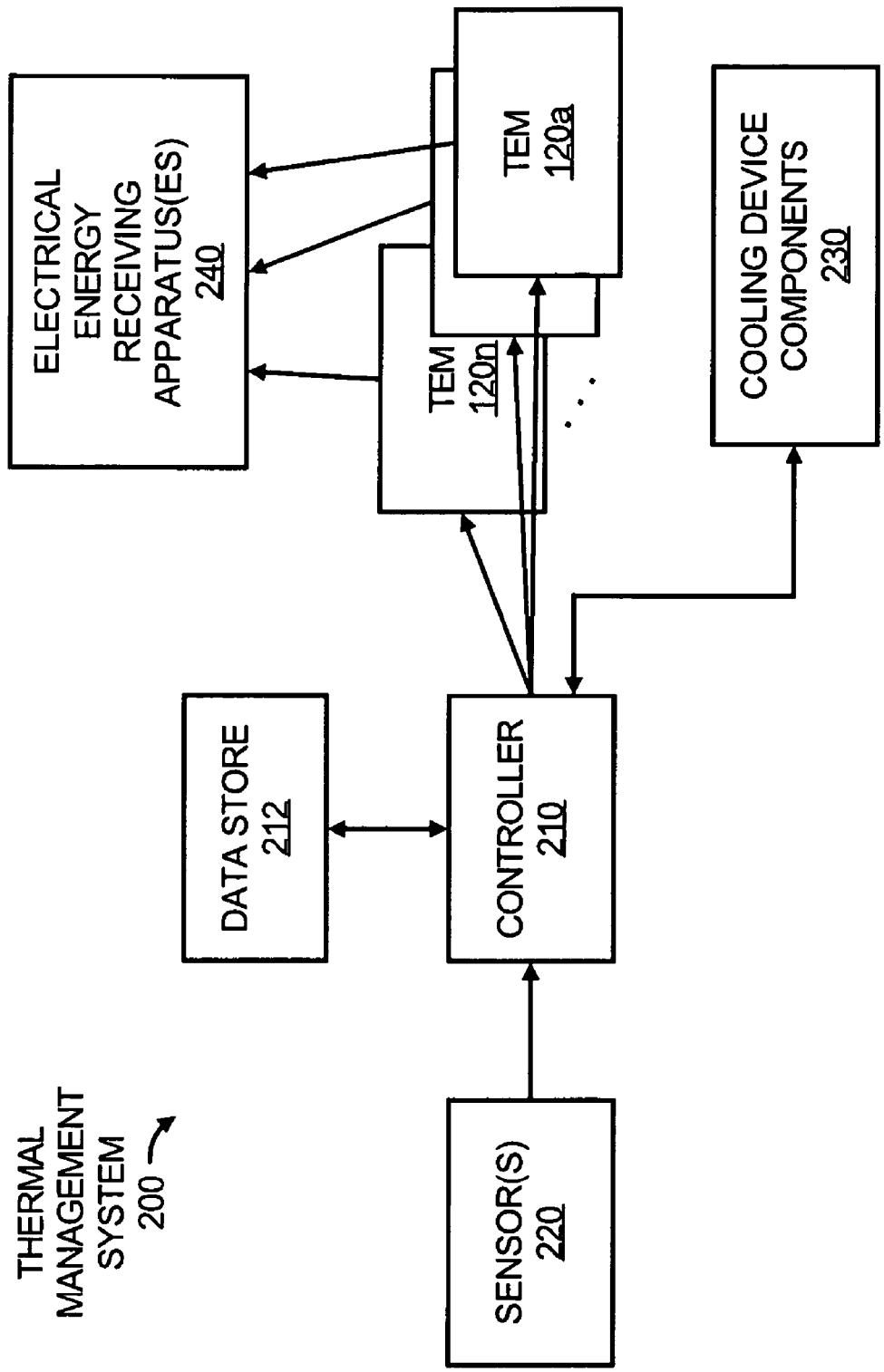
FIG. 2 illustrates a simplified block diagram of a thermal management system, according to an embodiment of the invention.

With reference now to FIG. 2, there is shown a simplified block diagram of a thermal management system 200, according to an example. It should be understood that the thermal management system 200 may include additional elements and that some of the elements described herein may be removed and/or modified without departing from a scope of the thermal management system 200.

The thermal management system 200 is depicted as including a controller 210, a data store 212, one or more sensors 220, cooling device components 230, one or more electrical energy receiving apparatus 240 and the TEMs 120a-120n. As shown in FIG. 2, the controller 210 is configured to receive input from the sensor(s) 220 and to control operations of both the TEMs 120a-120n and the cooling device components 230. It should, however, be understood that the controller 210 may control one of the TEMs 120a-120n or the cooling device components 230 without departing from a scope of the thermal management system 200.

According to an example, the sensors 220 comprise sensors positioned to detect one or more environmental conditions, such as, temperature, pressure, flowrate, phase, etc., of the fluid flow 130, 132 at various locations with respect to a TE-HEX 102. In the event that an environmental condition other than temperature is measured by the sensors 220, the controller 210 may infer the temperature of the airflow from the detected environmental conditions through use of conventional techniques. According to another example, the sensors 220 comprise sensors positioned to detect one or more environmental conditions of the coolant 116a, 116b at various locations along the pipe 112. By way of example, the sensors 220 may measure environmental conditions of the coolant 116a, 116b before and after the coolant 116a, 116b has exchanged heat with the TEMs 120a-120n.

In any regard, the sensors 220 are configured to communicate the detected environmental conditions to the controller 210 through a wired or wireless connection. Thus, for instance, the sensors 220 may be networked with the controller 210. The controller 210 may store the detected environmental condition information in the data store 212. In addition, the controller 210 may access other information stored in the data store 212 that defines how the controller 212 is to implement the detected environmental condition information in controlling one or both of the cooling device components 230 and the TEMs 120a-120n. In this regard, the controller 210 comprises one of a processor, ASIC, microcontroller, etc., configured to control one or both of the cooling device components 230 and the TEMs 120a-120n. As described in greater detail herein below, the controller 210 is configured to implement the detected temperature information in controlling at least one of a first thermoelectric module 120a, a second thermoelectric module 120b, and a cooling device component 230 of the heat exchanger 110 to achieve a predetermined goal.

The data store 212 comprises any device capable of storage of information or any combination of devices capable of storage of information in volatile and/or non-volatile form, such as DRAM, EEPROM, MRAM, flash memory, and the like. In addition, or alternatively, the data store 212 may comprise a device configured to read from and write to a removable media, such as, a floppy disk, a CD-ROM, a DVD-ROM, or other optical or magnetic media. In addition to storing sensed data received from the sensors 220, the data store 212 may also store one or more program instructions, which the controller 210 may execute in performing various operations in the thermal management system 200. Although the data store 212 has been depicted as forming a separate component from the controller 210, the data store 212 may be integrated with the controller 210 without departing from a scope of the thermal management system 200.

The cooling device components 230 may include any reasonably suitable apparatus, for instance, air conditioning units, heat exchangers, chilled water supplies, fans, blowers, etc., for providing the coolant 116a at a relatively low temperature. The cooling device components 230 may also be defined to include particular elements within other cooling elements, such as, a heat exchanger, a fan, etc., contained in within an air conditioning unit. The cooling system components 120 may also include secondary cooling components, such as, a cooling tower, that may not directly cool of the coolant 116a, but may nonetheless be an integral part of an overall cooling infrastructure.

The electrical energy receiving apparatus(es) 240 generally comprise any suitable apparatus capable of receiving and utilizing electrical energy generated in the TEMs 120a-120n. By way of example, electrical energy receiving apparatus(es) 240 may include one or more of the cooling device components 230, the controller 210, the sensors 220, etc. As another example, the electrical energy receiving apparatus(es) 240 may comprise other electronic devices, such as, servers, computers, hard drives, network switches, etc. As a further example, the electric energy receiving apparatus(es) 240 may comprise a battery that may be recharged with electrical energy received from the TEMs 120a-120n.

Various operations that the controller 210 is operable to perform will be described with respect to the following flow diagram of a method 300 depicted in FIG. 3. It should be understood that the method 300 represents a generalized illustration and that other steps may be added or existing steps may be removed, modified or rearranged without departing from a scopes of the method 300.

The description of the method 300 is made with reference to the thermal management system 200 illustrated in FIG. 2 and the thermal management systems 100, 100', 100" depicted in FIGS. 1A-1C, and thus makes reference to the elements cited therein. It should, however, be understood that the method 300 is not limited to the elements set forth in the thermal management systems 100, 100', 100", 200. Instead, it should be understood that the method 300 may be practiced by a system having a different configuration than that set forth in those systems.

Figure 3:
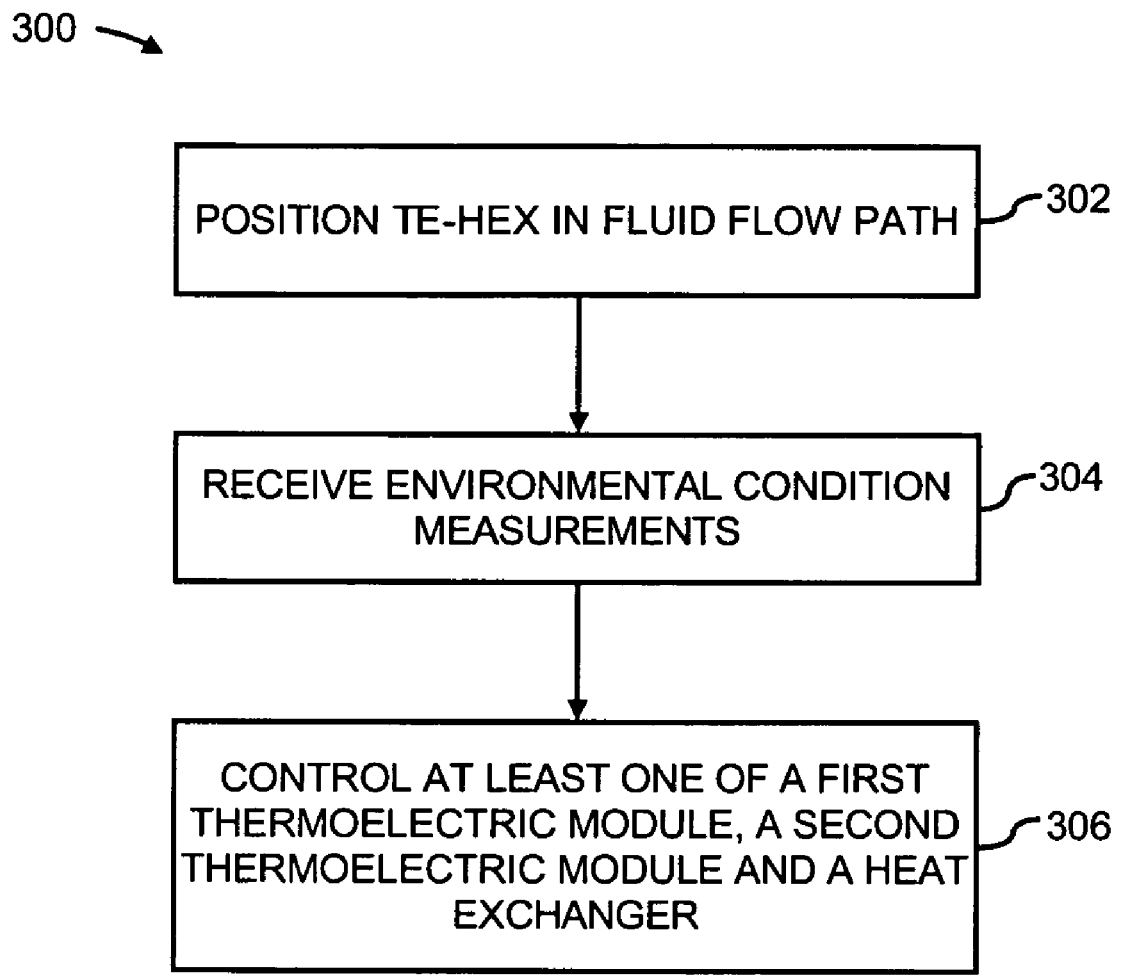
FIG. 3 shows a flow diagram of a method of controlling fluid flow temperature, according to an embodiment of the invention.

As shown in FIG. 3, at step 302, the TE-HEX 102 arrangement is positioned in a fluid flow path for which temperature control is desired. By way of example, the TE-HEX 102 arrangement may be positioned at an inlet and/or an outlet of an electronics rack or an air conditioning unit, in a ventilation tile, as part of a vehicle radiator system, etc. In addition, the TE-HEX 102 may have any of the arrangements depicted in FIGS. 1A-1C.

At step 304, the controller 210 receives environmental condition measurements detected by the sensors 220. The controller 210 may receive the environmental condition measurements directly from the sensors 220. In addition or alternatively, the controller 210 may receive previously detected environmental condition measurements that have been stored in the data store 212.

At step 306, the controller 210 controls at least one of a first thermoelectric module 120a, a second thermoelectric module 120b, and cooling system components 230 of the heat exchanger 110 based upon the environmental condition measurements received at step 306. In addition, the controller 210 controls at least one of the first thermoelectric module 120a, the second thermoelectric module 120b, and the cooling system components 230 of the heat exchanger 110 to achieve a predetermined goal.

According to a first example, the controller 210 controls at least one of the first thermoelectric module 120a, the second thermoelectric module 120b, and the cooling system components 230 of the heat exchanger 110 to provide a substantially uniform fluid temperature across at least a portion of the fluid flow path in which the TE-HEX 102 is positioned. In this example, the TE-HEX 102 may be positioned and controlled to ensure that the temperature of the fluid flow in one location is substantially equivalent to the temperature of the fluid flow in another location. For instance, the TE-HEX 102 may be positioned in the exhaust fluid flow path of high heat dissipating components.

According to a second example, the controller 210 controls at least one of the first thermoelectric module 120a, the second thermoelectric module 120b, and the cooling system components 230 of the heat exchanger 110 to at least one of substantially minimize total cost of ownership (TCO) and substantially maximize coefficient of performance (COP) in thermally managing the fluid flow. In this example, the controller 210 is configured to determine operational levels of the first thermoelectric module, the second thermoelectric module and the heat exchanger that results in at least one of a lowest TCO and a highest COP in thermally managing the fluid flow. In determining these operational levels, the controller 210 may factor the amount of electrical energy generated in the TEMs 120a-120n when they are operated as thermoelectric generators. Thus, for instance, the greater the amount of electrical energy generated by the TEMs 120a-120n, the lower the TCO and the higher the COP of the TE-HEX 102 in thermally managing the fluid flow.

According to a third example, the controller 210 controls at least one of the first thermoelectric module 120a, the second thermoelectric module 120b, and the cooling system components 230 of the heat exchanger 110 to ordinarily operate in a nominal operating state. The respective nominal operating states may include any state between and including a passive state up to and not including a maximum operating state. In this example, the controller 210 determines that a thermal disturbance has occurred to the fluid flow path. The controller 210 may determine that a thermal disturbance has occurred by, for instance, detection of a sharp increase the temperature of the fluid flow in the fluid flow path. As another example, the controller 210 may be informed of a thermal disturbance, such as, an air conditioning unit failure, a ventilation tile failure, a fan or blower failure, etc. This information may be manually input into the controller 210 by an operator or it be automatically supplied to the controller 210 by another computing device, for instance, a computing device that is configured to monitor the operations of the cooling system components 230.

Some of the operations set forth in the method 300 may be contained as a utility, program, or subprogram, in any desired computer accessible medium. In addition, some of the operations set forth in the method 300 may be embodied by a computer program, which may exist in a variety of forms both active and inactive. For example, they may exist as software program(s) comprised of program instructions in source code, object code, executable code or other formats. Any of the above may be embodied on a computer readable medium.

Exemplary computer readable storage devices include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 4:
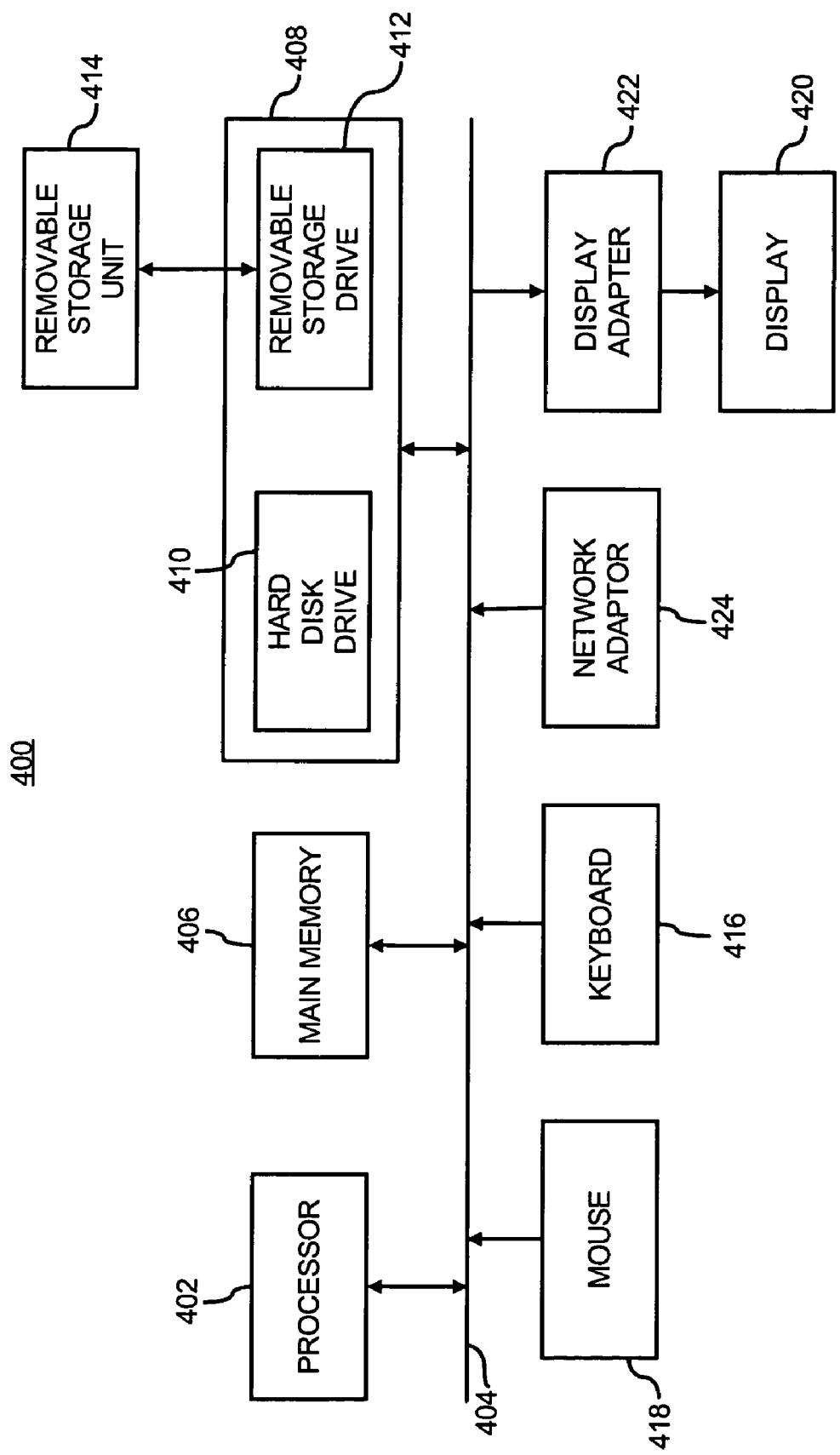
FIG. 4 shows a block diagram of a computing apparatus configured to implement or execute the controller depicted in FIG. 2, according to an embodiment of the invention.

FIG. 4 illustrates a block diagram of a computing apparatus 400 configured to implement or execute the functions of the controller 210 depicted in FIG. 2, according to an example. In this respect, the computing apparatus 400 may be used as a platform for executing one or more of the functions described hereinabove with respect to the controller 210.

The computing apparatus 400 includes a processor 402 that may implement or execute some of the steps described in the method 300. Commands and data from the processor 402 are communicated over a communication bus 404. The computing apparatus 400 also includes a main memory 406, such as a random access memory (RAM), where the program code for the processor 402, may be executed during runtime, and a secondary memory 408. The secondary memory 408 includes, for example, one or more hard disk drives 410 and/or a removable storage drive 412, representing a floppy diskette drive, a magnetic tape drive, a compact disk drive, etc., where a copy of the program code for the method 300 may be stored.

The removable storage drive 410 reads from and/or writes to a removable storage unit 414 in a well-known manner. User input and output devices may include a keyboard 416, a mouse 418, and a display 420. A display adaptor 422 may interface with the communication bus 404 and the display 420 and may receive display data from the processor 402 and convert the display data into display commands for the display 420. In addition, the processor(s) 402 may communicate over a network, for instance, the Internet, LAN, etc., through a network adaptor 424.

It will be apparent to one of ordinary skill in the art that other known electronic components may be added or substituted in the computing apparatus 400. It should also be apparent that one or more of the components depicted in FIG. 4 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A thermal management system comprising:
a first thermoelectric module;
a second thermoelectric module, wherein at least one of the first thermoelectric module and the second thermoelectric module comprises at least one of a thermoelectric cooler and a thermoelectric generator; and
a heat exchanger having a pipe having a first section, a second section and an intermediate section arranged between the first section and the second section, said intermediate section maintaining the first section and the second section in spaced apart planes, wherein the first thermoelectric module is thermally attached to the first section and the second thermoelectric module is thermally attached to the second section, and wherein the first thermoelectric module is spaced apart from the second thermoelectric module to enable fluid to flow between the first thermoelectric module and the second thermoelectric module.

2. The thermal management system according to claim 1, wherein the heat exchanger further comprises a coolant in the pipe and a cooling device for cooling the coolant in the pipe.

3. The thermal management system according to claim 1, wherein the first thermoelectric module and the second thermoelectric module each have a heat absorbing side and a heat dissipating side, and wherein the heat absorbing side of the first thermoelectric module is thermally attached to the first section and the heat absorbing side of the second thermoelectric module is thermally attached to the second section.

4. The thermal management system according to claim 1, wherein the first thermoelectric module and the second thermoelectric module each have a heat absorbing side and a heat dissipating side, and wherein the heat absorbing side of the first thermoelectric module is thermally attached to the first section and the heat dissipating side of the second thermoelectric module is thermally attached to the second section.

5. The thermal management system according to claim 1, wherein the first thermoelectric module and the second thermoelectric module each have a heat absorbing side and a heat dissipating side, and wherein the heat dissipating side of the first thermoelectric module is thermally attached to the first section and the heat dissipating side of the second thermoelectric module is thermally attached to the second section.

6. A thermal management system comprising:
a first thermoelectric module;
a second thermoelectric module;
a heat exchanger having a pipe having a first section, a second section and an intermediate section arranged between the first section and the second section, said intermediate section maintaining the first section and the second section in spaced apart planes, wherein the first thermoelectric module is thermally attached to the first section and the second thermoelectric module is thermally attached to the second section, and wherein the first thermoelectric module is spaced apart from the second thermoelectric module to enable fluid to flow between the first thermoelectric module and the second thermoelectric module;
a plurality of sensors positioned to detect one or more environmental conditions at multiple locations; and
a controller for receiving sensed data from the plurality of sensors, to process the sensed data and to control at least one of the heat exchanger, the first thermoelectric module and the second thermoelectric module to achieve a predetermined goal.

7. The thermal management system according to claim 6, wherein the predetermined goal comprises maintaining a substantially uniform fluid temperature across at least a portion of an fluid flow path in which the first thermoelectric module, the second thermoelectric module, and the pipe of the heat exchanger are positioned.

8. The thermal management system according to claim 6, wherein the predetermined goal comprises operating the first thermoelectric module, the second thermoelectric module, and the heat exchanger to result in at least one of a lowest total cost of ownership and a highest coefficient of performance.

9. A method of controlling fluid flow temperature, said method comprising:
positioning at least part of a thermal management system in a fluid flow path, said thermal management system having a first thermoelectric module, a second thermoelectric module, and a heat exchanger, said heat exchanger having a pipe having a first section, a second section and an intermediate section arranged between the first section and the second section, said intermediate section maintaining the first section and the second section in spaced apart planes, wherein the first thermoelectric module is thermally attached to the first section and the second thermoelectric module is thermally attached to the second section, and wherein the first thermoelectric module is spaced apart from the second thermoelectric module to enable fluid to flow between the first thermoelectric module and the second thermoelectric module; and receiving environmental condition measurements detected at a plurality of locations and controlling at least one of the first thermoelectric module, the second thermoelectric module and the heat exchanger based upon the received environmental condition measurements.

10. The method according to claim 9, wherein controlling at least one of the first thermoelectric module, the second thermoelectric module and the heat exchanger based upon the received environmental condition measurements further comprises controlling at least one of the first thermoelectric module, the second thermoelectric module and the heat exchanger based upon the received environmental condition measurements to achieve a predetermined goal.

11. The method according to claim 10, wherein controlling to achieve a predetermined goal further comprises controlling at least one of the first thermoelectric module, the second thermoelectric module and the heat exchanger to provide a substantially uniform fluid temperature across at least a portion of the fluid flow path.

12. The method according to claim 10, further comprising:
monitoring costs associated with operating the first thermoelectric module, the second thermoelectric module and the heat exchanger;
determining operational levels of the first thermoelectric module, the second thermoelectric module and the heat exchanger that results in at least one of a lowest total cost of ownership and a highest coefficient of performance; and
wherein controlling to achieve a predetermined goal further comprises controlling at least one of the first thermoelectric module, the second thermoelectric module and the heat exchanger to operate at the determined operational levels.

13. The method according to claim 10, wherein the first thermoelectric module, the second thermoelectric module, and the heat exchanger have respective nominal operating states, said method further comprising:
determining that a thermal disturbance has occurred to the fluid flow path; and
wherein controlling to achieve a predetermined goal further comprises controlling at least one of the first thermoelectric module, the second thermoelectric module and the heat exchanger to operate at respective maximum operating states to thereby compensate for the thermal disturbance.

14. A computer readable storage medium on which is embedded one or more computer programs, said one or more computer programs implementing a method of controlling fluid flow temperature using a thermal management system positioned in an fluid flow path to be controlled, said thermal management system having a first thermoelectric module, a second thermoelectric module, and a heat exchanger, said heat exchanger having a pipe having a first section, a second section and an intermediate section arranged between the first section and the second section, said intermediate section maintaining the first section and the second section in spaced apart planes, wherein the first thermoelectric module is thermally attached to the first section and the second thermoelectric module is thermally attached to the second section, and wherein the first thermoelectric module is spaced apart from the second thermoelectric module to enable fluid to flow between the first thermoelectric module and the second thermoelectric module, said one or more computer programs comprising a set of instructions for:
receiving environmental condition measurements detected at a plurality of locations; and
controlling at least one of the first thermoelectric module, the second thermoelectric module and the heat exchanger based upon the received environmental condition measurements to achieve a predetermined goal.

* * * * *